(12) United States Patent
Steckel et al.

(10) Patent No.: US 10,192,932 B2
(45) Date of Patent: Jan. 29, 2019

(54) QUANTUM DOT LED AND OLED INTEGRATION FOR HIGH EFFICIENCY DISPLAYS

(71) Applicant: Apple Inc., Cupertino, CA (US)

(72) Inventors: Jonathan S. Steckel, Cupertino, CA (US); Mathew K. Mathai, San Jose, CA (US); Paul S. Drzaic, Morgan Hill, CA (US); Hitoshi Yamamoto, Palo Alto, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/244,906

(22) Filed: Aug. 23, 2016

(65) Prior Publication Data

US 2017/0221969 A1    Aug. 3, 2017

Related U.S. Application Data

(60) Provisional application No. 62/290,423, filed on Feb. 2, 2016.

(51) Int. Cl.
*H01L 27/32* (2006.01)
*H01L 51/52* (2006.01)
*H01L 51/50* (2006.01)
*H01L 51/00* (2006.01)

(52) U.S. Cl.
CPC ...... *H01L 27/3209* (2013.01); *H01L 27/3211* (2013.01); *H01L 51/502* (2013.01); *H01L 51/5044* (2013.01); *H01L 51/5072* (2013.01); *H01L 51/5278* (2013.01); *H01L 51/0003* (2013.01); *H01L 51/0013* (2013.01); *H01L 51/5016* (2013.01); *H01L 2251/5369* (2013.01)

(58) Field of Classification Search
CPC .................................................. H01L 27/3209
See application file for complete search history.

(56) References Cited

U.S. PATENT DOCUMENTS

| 9,064,822 B2 | 6/2015 | Park et al. |
| 10,048,412 B2* | 8/2018 | Li ............................ G02B 5/20 |
| 2006/0274226 A1* | 12/2006 | Im .......................... B82Y 10/00 |
| | | 349/71 |
| 2007/0001570 A1* | 1/2007 | Nomura ............... H01L 51/5265 |
| | | 313/113 |
| 2008/0103308 A1* | 5/2008 | Ragini ................ C07F 15/0033 |
| | | 546/5 |

(Continued)

FOREIGN PATENT DOCUMENTS

CN    105304681 A    2/2016

OTHER PUBLICATIONS

Xingling Dai et al., Solution-processed, high-performance light-emitting diodes based on quantum dots, Nov. 6, 2014, Nature, vol. 515, pp. 96-99.*

(Continued)

*Primary Examiner* — Victoria K Hall
(74) *Attorney, Agent, or Firm* — Jaffery Watson Mendonsa & Hamilton LLC

(57) ABSTRACT

Displays including hybrid pixels including an OLED subpixel and QD-LED subpixel are described. In an embodiment, OLED and QD-LED stacks are integrated into the same pixel with multiple common layers shared by the OLED and QD-LED stacks.

13 Claims, 7 Drawing Sheets

(56) References Cited

U.S. PATENT DOCUMENTS

| | | | | |
|---|---|---|---|---|
| 2010/0308353 A1* | 12/2010 | Grabowski | ......... | H01L 51/5278 257/89 |
| 2011/0095279 A1* | 4/2011 | Mizuno | ............... | H01L 27/3206 257/40 |
| 2011/0121738 A1* | 5/2011 | Kawano | ............... | G09G 3/3233 315/130 |
| 2012/0286296 A1* | 11/2012 | So | ........................ | B82Y 10/00 257/82 |
| 2014/0175390 A1* | 6/2014 | Kim | ..................... | H01L 51/56 257/40 |
| 2014/0183471 A1* | 7/2014 | Heo | .................... | H01L 27/322 257/40 |
| 2015/0200380 A1* | 7/2015 | Huang | ............... | H01L 51/0003 257/40 |
| 2015/0228697 A1 | 8/2015 | Liu et al. | | |
| 2015/0318506 A1 | 11/2015 | Zhou et al. | | |
| 2016/0005797 A1* | 1/2016 | Huang | ............... | H01L 27/3209 257/40 |
| 2016/0079316 A1* | 3/2016 | Zhou | .................. | H01L 51/5278 257/13 |
| 2016/0126463 A1* | 5/2016 | Kadoma | ............ | H01L 51/0054 257/40 |
| 2016/0197297 A1* | 7/2016 | Choi | .................... | H01L 51/504 257/40 |
| 2016/0218311 A1* | 7/2016 | Niboshi | .............. | H01L 51/5084 |
| 2016/0219673 A1* | 7/2016 | Jaeger | ................ | H05B 33/0872 |
| 2016/0240590 A1* | 8/2016 | Liu | ..................... | H01L 51/5206 |
| 2016/0293676 A1* | 10/2016 | Komatsu | ................. | G02B 5/20 |
| 2016/0293875 A1* | 10/2016 | Zhang | .................. | H01L 51/502 |
| 2017/0025478 A1* | 1/2017 | Wehlus | ............... | H01L 51/5265 |
| 2017/0077406 A1* | 3/2017 | Xie | ....................... | H01L 27/3244 |
| 2017/0162643 A1* | 6/2017 | Yang | ................... | H01L 27/3265 |
| 2017/0179443 A1* | 6/2017 | Osawa | .................... | H01L 51/56 |
| 2017/0207398 A1* | 7/2017 | Yang | ................... | H01L 51/0077 |
| 2018/0108872 A1* | 4/2018 | Li | ........................ | H01L 51/504 |
| 2018/0130853 A1* | 5/2018 | Pan | ..................... | H01L 27/3211 |

OTHER PUBLICATIONS

V. Wood & V. Bulovic, Colloidal quantum dot light-emitting devices, Jul. 7, 2010, Nano Reviews, vol. 1, article 5202, pp. 1-7.*

Kwak et al., Bright and Efficient Full-Color Colloidal Quantum Dot Light-Emitting Diodes Using an Inverted Device Structure, Apr. 2, 2012, Nano Letters, vol. 12, pp. 2362-2366.*

Dai, et al., "Solution-processed, high-performance light-emitting diodes based on quantum dots," Nature, vol. 515, Nov. 2014, 15 pages.

* cited by examiner

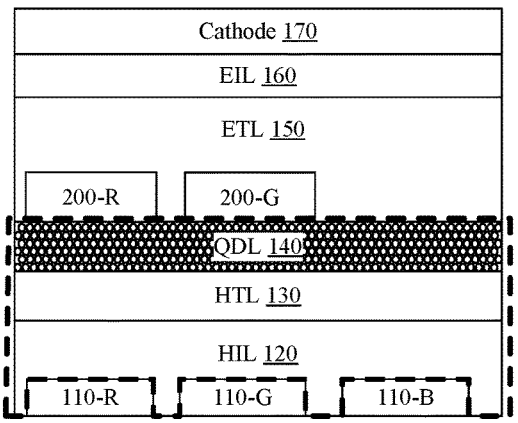
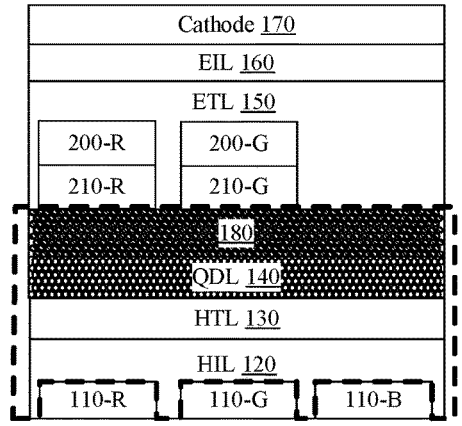
FIG. 7  FIG. 8
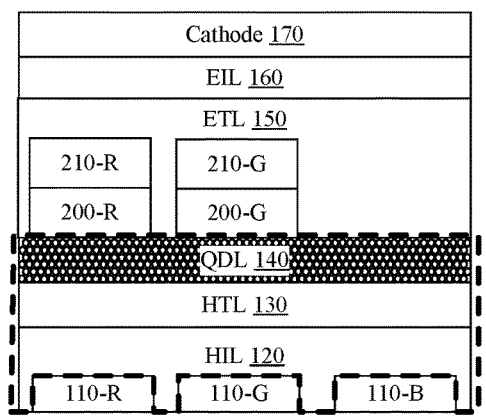
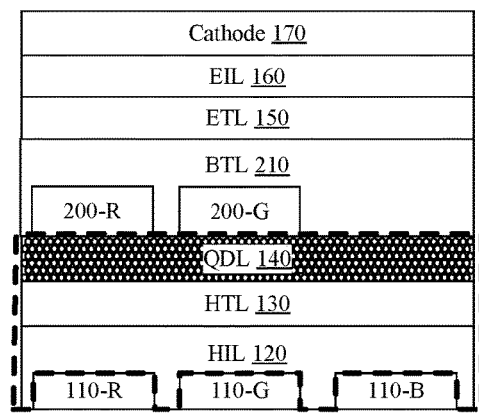
FIG. 9  FIG. 10

QUANTUM DOT LED AND OLED INTEGRATION FOR HIGH EFFICIENCY DISPLAYS

RELATED APPLICATIONS

This application claims the priority of U.S. Provisional Application No. 62/290,423 filed on Feb. 2, 2016, which is incorporated herein by reference.

BACKGROUND

Field

Embodiments described herein relate to display systems. More particularly, embodiments relate to display systems with hybrid emissive light emitting diodes (LEDs).

Background Information

State of the art displays for phones, tablets, computers and televisions utilize glass substrates with thin-film transistors (TFT) to control transmission of backlight through pixels based on liquid crystals. More recently emissive displays such as those based on organic light emitting diodes (OLED) have been introduced because they can have a faster response time, and be more power efficient, allowing each pixel to be turned off completely when displaying black or dark colors, and be compatible with plastic substrates. Even more recently, quantum dot light emitting diodes (QD-LEDs) have been introduced as an alternative display technology, potentially being more power efficient that OLEDs.

SUMMARY

Display systems and hybrid pixel arrangements are described. In an embodiment, a display includes a hybrid pixel with an OLED subpixel and a QD-LED subpixel. A common hole transport layer is in the OLED subpixel and the QD-LED subpixel. A quantum dot layer is over the common hole transport layer in the QD-LED subpixel, and an organic emission layer that includes a phosphorescent material is over the common hole transport layer in the OLED subpixel. A common electron transport layer is over the quantum dot layer in the QD-LED subpixel, and over the organic emission layer in the OLED subpixel. A common top electrode layer is over the common electron transport layer in the OLED subpixel and the QD-LED subpixel.

In an embodiment, a method of forming a display includes forming a common hole transport layer over a display backplane in using a first solution technique, where the common hole transport layer is formed over the display backplane in an OLED subpixel and a QD-LED subpixel. A quantum dot layer is then formed over the common hole transport layer in the QD-LED subpixel. An organic emission layer including a phosphorescent material may then be evaporated over the common hole transport layer in the OLED subpixel. A common electron transport layer may be evaporated over the quantum dot layer in the QD-LED subpixel, and over the organic emission layer in the OLED subpixel, A common top electrode layer may then be formed over the common electron transport layer in the OLED subpixel and the QD-LED subpixel.

In an embodiment, a display includes a tandem hybrid pixel including an OLED subpixel and a QD-LED subpixel. A common hole transport layer is in the OLED subpixel and the QD-LED subpixel. A common quantum dot layer is over the common hole transport layer in the QD-LED subpixel and in the OLED subpixel. A semi-common charge generation layer is over the common quantum dot layer in the OLED subpixel. A first cathode is over the common quantum dot layer in the QD-LED subpixel. A semi-common hole transport layer is over the semi-common charge generation layer in the OLED subpixel. An organic emission layer is over the semi-common hole transport layer in the OLED subpixel. A semi-common electron transport layer is over the organic emission layer in the OLED subpixel, and a semi-common second cathode is over the semi-common electron transport layer in the OLED subpixel. In an embodiment, a common nanoparticle electron transport layer including metal-oxide nanoparticles is over the common quantum dot layer in the QD-LED subpixel and in the OLED subpixel, the semi-common charge generation layer is over the common nanoparticle electron transport layer in the OLED subpixel, and the first cathode is over the common nanoparticle electron transport layer in the QD-LED subpixel.

In an embodiment, a display includes a tandem hybrid pixel including an OLED subpixel and a QD-LED subpixel. A common hole transport layer is in the OLED subpixel and the QD-LED subpixel. A common quantum dot layer is over the common hole transport layer in the QD-LED subpixel and in the OLED subpixel. A common charge generation layer is over the common quantum dot layer in the OLED subpixel and in the QD-LED subpixel, and a common hole transport layer is over the common charge generation layer in the OLED subpixel and in the QD-LED subpixel. An organic emission layer is over the common hole transport layer in the OLED subpixel. A common electron transport layer is over the common hole transport layer in the OLED subpixel and in the QD-LED subpixel, and the common electron transport layer is additionally over the organic emission layer in the OLED subpixel. A common cathode is over the common electron transport layer in the OLED subpixel and in the QD-LED subpixel. In an embodiment, a common nanoparticle electron transport layer including metal-oxide nanoparticles is over the common quantum dot layer in the QD-LED subpixel and in the OLED subpixel, and the common charge generation layer is over the common nanoparticle electron transport layer in the OLED subpixel and in the QD-LED subpixel.

In an embodiment a display with a tandem QD-LED and OLED tandem stack includes a common anode, a common hole transport layer over the common anode, a common quantum dot layer over the common hole transport layer, a common charge generation layer over the common quantum dot layer. a common hole transport layer over the common charge generation layer, a common organic emission layer over the common hole transport layer, a common electron transport layer over the common organic emission layer, and a common cathode over the common electron transport layer. In an embodiment, the tandem QD-LED and OLED tandem stack further includes a second common organic emission layer between the common organic emission layer and the common electron transport layer. In an embodiment, the tandem QD-LED and OLED tandem stack further includes a second common electron transport layer over the common organic emission layer, a second charge generation layer over the second common electron transport layer, and a second hole transport layer over the second charge generation layer, where the second common organic emission layer is over the second hole transport layer.

BRIEF DESCRIPTION OF THE DRAWINGS

FIGS. 7-10 are schematic cross-sectional side view illustrations of hybrid pixels including a common quantum dot layer in accordance with embodiments.

DETAILED DESCRIPTION

Figure 1:
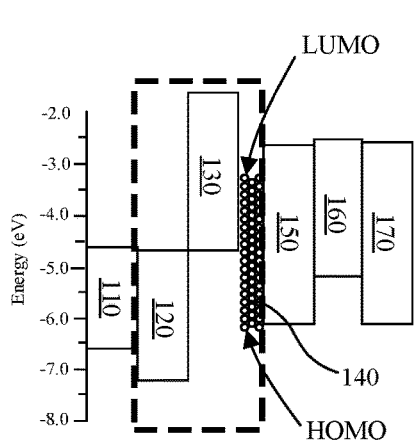
FIG. 1 is an energy diagram of the layers in a QD-LED stack in accordance with an embodiment.

Embodiments describe display systems with hybrid pixels. In an embodiment, a display includes a hybrid pixel including an OLED subpixel and a QD-LED subpixel. A common hole transport layer is in the OLED subpixel and the QD-LED subpixel with commonly shared layers. A quantum dot (QD) layer is over the common hole transport layer in the QD-LED subpixel. In some embodiments, the QD layer is a common layer over the common hole transport layer in the OLED subpixel and the QD-LED subpixel. An organic emission layer is over the common hole transport layer in the OLED subpixel. In some embodiments the organic emission layer is over the common QD layer in the OLED subpixel. A common electron transport layer is over the QD layer in the QD-LED subpixel and over the organic emission layer in the OLED subpixel. A common top electrode layer is over the common electron transport layer in the OLED subpixel and the QD-LED subpixel.

While power efficiency for OLEDs is a potential benefit of OLED displays, conventional fluorescent OLEDs are known to have a maximum internal quantum efficiency (IQE) of around 25%. Phosphorescent OLED systems may be more efficient, and can have IQE values approaching 100%. As such, it may be advantageous to employ phosphorescent OLED materials in displays. Red and green phosphorescent OLED devices have high efficiencies, saturated colors, and acceptable lifetimes. For blue phosphorescent materials, however, available materials tend to have unacceptably short lifetime, unsaturated colors, or both. As such, there is a need to improve the blue emitter system in an OLED display, while maintaining the acceptable performance of red and green phosphorescent materials.

In an embodiment, a hybrid pixel includes a blue-emitting QD-LED pixel and one or more emitting OLED subpixels, such as a green-emitting OLED subpixel and a red-emitting OLED subpixel in a RGB hybrid pixel layout. In a specific embodiment, the red OLED subpixel and green OLED subpixel include phosphorescent OLED materials. It is to be appreciated that an RGB hybrid pixel layout is exemplary, and embodiments are not so limited. Other exemplary pixel arrangements include red-green-blue-yellow-cyan (RBGYC), red-green-blue-white (RGBW), or other sub-pixel matrix schemes where the pixels have a different number of sub-pixels.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known display processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "above", "over", "to", "between", and "on" as used herein may refer to a relative position of one layer with respect to other layers. One layer "above", "over", or "on" another layer may be directly in contact with the other layer or may have one or more intervening layers. One layer "between" layers may be directly in contact with the layers or may have one or more intervening layers.

Referring now to FIGS. 1-5 various cross-sectional side view illustrations are provided of QD-LED stacks in accordance with embodiments. In the particular embodiments illustrated (including those illustrated in FIGS. 6-9), a dashed outline is provided around a group of layers that may be fabricated using solution-based processing. These groupings are exemplary, and intended to visually illustrate the potential impact of solution-based processing, however, the embodiments are not limited to solution-based processing. In one aspect, increasing the ratio of solution-based processed layers can potentially lead to increased performance and reduced cost of fabrication. For example, solution-based processing may have a reduced time of production compared to evaporation techniques. Solution-based processing of layers may potentially reduce the number of processing steps, and increase yield. For example, solution-based process may negate concerns with exposing evaporated species to air, solvent, etc. In some embodiments, solution-based processing is implemented only prior to the formation of an organic layer by thermal evaporation.

FIG. 1 is an energy diagram of the layers in a QD-LED stack in accordance with an embodiment. As shown, the QD-LED stack may include an anode 110, a hole injection layer (HIL) 120 on/over the anode 110, a hole transport layer (HTL) 130 on/over the HIL 120, a QD layer 140 on/over the HTL 130, an electron transport layer (ETL) 150 on/over the QD layer 140, an electron injection layer (EIL) 160 on/over the ETL 150, and a cathode 170 on/over the EIL 160. As described and illustrated herein a layer on/over another layer may be directly on (in contact) with the other layer or may have or more intervening layers. In operation, a voltage is applied across the QD-LED stack such that the anode is positive with respect to the cathode. Current flows through the QD-LED stack from the cathode to anode, as electrons are injected from the cathode 170 into the lowest unoccupied molecular orbital (LUMO) of the QD layer 140, while electrons are withdrawn toward the anode 110 from the highest occupied molecular orbital (HOMO) of the QD layer 140 (alternately described as hole injection into the HOMO of the QD layer 140). Recombination of electrons and holes in the QD layer 140 is accompanied by emission of radiation, the frequency of which dependent upon the band gap of the QDs, or the difference in energy (eV) between the HOMO and LUMO. It is to be appreciated that the particular energy levels illustrated in FIGS. 1-5 are exemplary, and that the energy levels are variable. Accordingly, the particular energy levels illustrated are provided for illustrative purposes only, and embodiments are not limited to the specific energy levels illustrated.

Still referring to FIG. 1, an anode 110 is formed on a display substrate, such as a TFT substrate, or substrate including redistribution lines. Anode 110 may be formed of a variety of electrically conductive materials. In an embodiment, anode 110 is formed of indium-tin-oxide (ITO). For example, ITO may be formed by sputtering or thermal evaporation. In an embodiment, an array of anodes 110 is sputtered onto a display substrate through a mask, such as a fine metal mask, with a separate anode 110 formed in each subpixel.

As shown, a HIL 120 is formed on the anode 110. In accordance with embodiments, the HIL 120 may be a common layer shared by multiple subpixels within a pixel, and may be a common layer across multiple pixels. The HIL 120 facilitates the injection of positive charge (holes) from the anode 110 into the HTL 130. The HIL 120 may be formed of materials such as conductive polymer-based materials (e.g. poly thiophenes, poly anilines), combination of arylamine based hole transport host and electron accepting dopant (e.g. charge transfer salts), strongly electron accepting small organic molecules, metal oxides. The HIL 120 may be formed using techniques such as spin coating, ink jet printing, slot die coating, nozzle printing, contact printing, gravure printing, any solution printing technology, as well as thermal evaporation.

As shown, a HTL 130 is formed on the HIL 120. In accordance with embodiments, the HTL 130 may be a common layer shared by multiple subpixels within a pixel, and may be a common layer across multiple pixels. The HTL 130 transports positive charge (holes) to the QD layer 140, the emissive layer in the QD-LED stack, and physically separates the HIL 120 from the QD layer 140. HTL 130 may be formed of electron rich materials such as arylamines, polyfluorene derivatives, and nanoparticle metal oxides (e.g. NiO). The HTL 130 may be formed using techniques such as spin coating, ink jet printing, slot die coating, nozzle printing, contact printing, gravure printing, any solution printing technology, as well as thermal evaporation.

As shown, a QD layer 140 is formed on the HTL 130. In accordance with embodiments, the QD layer 140 may be formed or patterned only in a QD-LED subpixel, or the QD layer 140 may be a common layer shared by multiple subpixels within a pixel, or may be a common layer across multiple pixels. The QD layer 140 may be formed of light emitting semiconductor nanoparticles that emit light at desired wavelength and full width at half max. Exemplary nanoparticles include spherical, rod shaped, platelet (2D quantum well) including semiconductor materials such as CdSe, InP, GaSe, etc. The QD layer 140 may be formed using techniques such as spin coating, ink jet printing, slot die coating, nozzle printing, contact printing, gravure print-ing, and any solution printing technology. In an embodiment QD layer 140 may be formed by transfer printing an array of QD layers 140 into an array of subpixels.

As shown, an ETL 150 is formed on the QD layer 140. In accordance with embodiments, the ETL 150 may be a common layer shared by multiple subpixels within a pixel, and may be a common layer across multiple pixels. The ETL 150 may be a high electron mobility layer that transports negative charge (electrons) into the QD layer 140 and physically separates the EIL 160 from the QD layer 140. ETL 150 may be formed of electron deficient materials such as organometallic compounds, organic small molecules (e.g. substituted benzimidazoles), and nanoparticle metal oxides (e.g. ZnO). The ETL 150 may be formed using techniques such as spin coating, ink jet printing, slot die coating, nozzle printing, contact printing, gravure printing, any solution printing technology, as well as thermal evaporation.

As shown, an EIL 160 is formed on the ETL 150. In accordance with embodiments, the EIL 160 may be a common layer shared by multiple subpixels within a pixel, and may be a common layer across multiple pixels. The EIL 160 facilitates the injection of negative charge (electrons) from the electrode into the ETL 150. EIL 160 may be formed of alkali metal salts such as LiF, low work function metals such as Ca, Ba, and n-doped material (e.g. combination of electron transport material and electron donating material). In an embodiment, the EIL 160 is formed by thermal evaporation.

As shown, a cathode 170 is formed on the EIL 160. Cathode 170 may be formed of a variety of electrically conductive materials, including transparent or semi-transparent materials. In accordance with embodiments, the cathode 170 may be a common layer shared by multiple subpixels within a pixel, and may be a common layer across multiple pixels. In an embodiment, cathode 170 is formed of materials such as Ca/Mg, Sm/Au, Yb/Ag, Ca/Ag, Ba/Ag, and Sr/Ag. For example, in a double layer Ca/Mg the Ca layer has a low work-function for electron injection, whereas a Mg capping layer improves electrical conductance of the cathode 170. In an embodiment, cathode 170 is formed by thermal evaporation.

Figure 2:
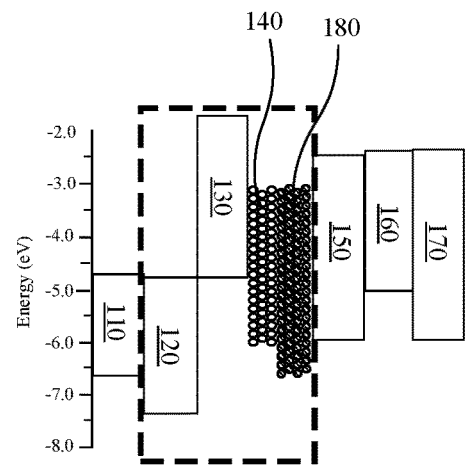
FIG. 2 is an energy diagram of the layers in a QD-LED stack including a metal oxide nanoparticle electron transport layer in accordance with an embodiment.

Referring now to FIG. 2, an energy diagram similar to FIG. 1 is provided with the addition of a nanoparticle ETL 180 formed between the QD layer 140 and the ETL 150 in accordance with an embodiment. In an embodiment, nanoparticle ETL 180 includes an assembly of metal oxide nanoparticles, such as ZnO nanoparticles. In the embodiment illustrated, nanoparticle ETL 180 facilitates the transport of electrons from ETL 150 to the QD layer 140 and physically separates the QDs within QD layer 140 from an organic ETL 150. In an embodiment, ETL 180 is formed using a technique such as spin coating, ink jet printing, slot die coating, nozzle printing, contact printing, gravure printing, and any solution printing technology. In an embodiment ETL 180 may be formed by transfer printing an array of ETLs 180 into an array of subpixels. In an embodiment, transfer printing includes transferring an ETL 180/QD layer 140 stack.

Figure 3:
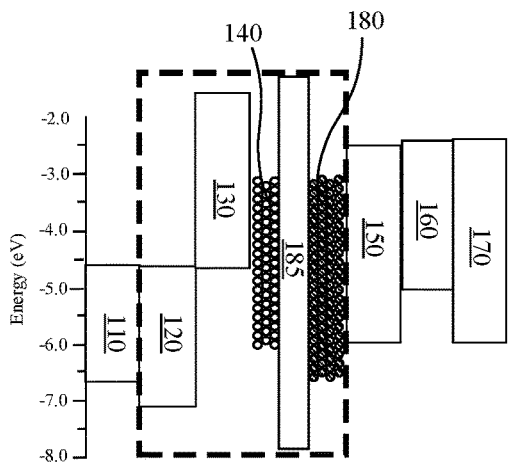
FIG. 3 is an energy diagram of the layers in a QD-LED stack including an insulating layer between a quantum dot layer and a metal oxide nanoparticle electron transport layer in accordance with an embodiment.

Referring now to FIG. 3, an energy diagram similar to FIG. 2 is provided with the addition of an insulating layer 185 formed between the QD layer 140 and the nanoparticle ETL 180 in accordance with an embodiment. The insulating layer 185 may function to modulate electron current into the QD layer 140, or more specifically electron injection from the nanoparticle ETL 180 to the QD layer 140 in order to mitigate excess electron current. This modulation may be adjusted by composition and thickness of the insulating layer 185. In an embodiment, the insulating layer is nanometers to tens of nanometers thick. In an embodiment, insulating layer 185 is formed of poly (methyl methacrylate) (PMMA). In an embodiment, insulating layer 185 is formed using a technique such as spin coating, ink jet printing, slot die coating, nozzle printing, contact printing, gravure printing, and any solution printing technology. In an embodiment insulating layer 185 may be formed by transfer printing an array of insulating layers 185 into an array of subpixels. In an embodiment, transfer printing includes transferring an ETL 180/insulating layer 185/QD layer 140 stack.

Figure 4:
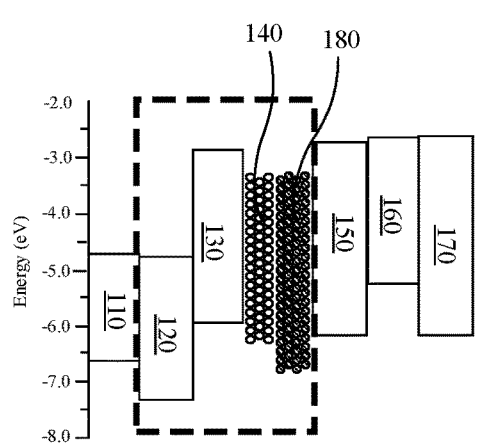
FIG. 4 is an energy diagram of the layers in a QD-LED stack including a hole transport layer with modified energy levels in accordance with an embodiment.

Referring now to FIG. 4, an energy diagram similar to FIG. 2 is provided with modified energy levels of the HTL 130 in accordance with an embodiment. For example, the HOMO and LUMO energy levels of the HTL 130 may be modified by the use of non-traditional deep HOMO based compounds to more closely match the QD HOMO energy level. In an embodiment, the energy difference between the HTL 130 HOMO energy level and the QD layer 140 HOMO energy level is less than 0.5 eV with the inclusion of non-traditional deep HOMO based compounds for HTL 130. Exemplary materials include nanoparticle metal oxides (e.g. NiO), and organic based molecules (e.g. acene and carbizole derivative based compounds, carbizole derivative based polymers, polyphenylenes, derivatized triphenylenes). In an embodiment, HTL 130 is formed using any technique previously described for HTL 130.

Figure 5:
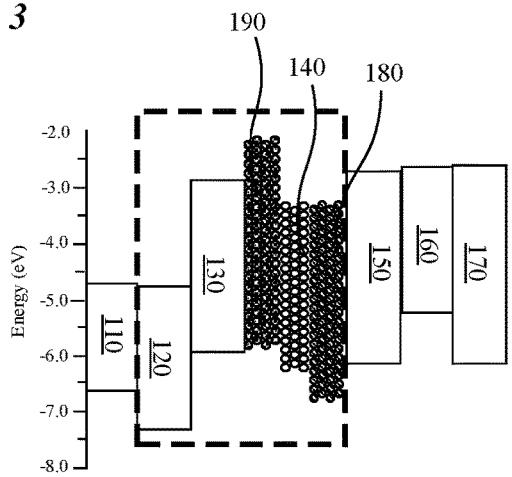
FIG. 5 is an energy diagram of the layers in a QD-LED stack including a metal oxide nanoparticle hole transport layer in accordance with an embodiment.

Referring now to FIG. 5, an energy diagram similar to FIG. 4 is provided with the addition of a metal oxide nanoparticle HTL 190 between the QD layer 140 and the HTL 130 in accordance with an embodiment. In an embodiment, metal oxide nanoparticle HTL 190 includes an assembly of metal oxide nanoparticles, such as NiO nanoparticles. In the embodiment illustrated, nanoparticle HTL 190 facilitates the transport of holes from HTL 130 to the QD layer 140 and physically separates the QDs within QD layer 140 from an organic HTL 130. The HTL 190 may be formed using techniques such as spin coating, ink jet printing, slot die coating, nozzle printing, contact printing, gravure printing, and any solution printing technology. In an embodiment HTL 190 may be formed by transfer printing an array of HTLs 190 into an array of subpixels. In an embodiment, transfer printing includes transferring an HTL 190/QD layer 140 stack. In an embodiment, transfer printing includes transferring an HTL 190/QD layer 140/ETL 180 stack. In an embodiment, transfer printing includes transferring an HTL 190/QD layer 140//insulating layer 185/ETL 180 stack.

Referring now to FIGS. 6-9 various hybrid pixel layouts are provided to illustrate the integration of QD-LED and OLED subpixels within a display. In particular, the illustrated hybrid pixel layouts are based upon the QD-LED stack structures illustrated and described with regard to FIGS. 1, 2 and 4. However, these illustrations are exemplary and may include additional layers, such as insulating layer 185 and HTL 190. Accordingly, the implementation of insulating layer 185 and HTL 190 is not limited to the embodiments illustrated and described with regard to FIGS. 3 and 5.

In the case of electroluminescent displays, the red, green, and blue subpixels within a single display pixel are comprised of an assembly of layers common to all three subpixels and layers specific to a particular subpixel. In accordance with some embodiments, the common layers in the hybrid pixel may include the HIL 120, HTL 130, and ETL 150, EIL 150, and cathode 170 layer. In some embodiments, the layers specific to each subpixel may include the buffer transport layers (BTLs) 210 and the emissive layers (e.g. organic emission layers 200-R, 200-G, and QD layer 140). In some embodiment, the BTL 210 and/or QD layer 140 may be common layers. The thickness of the common layers and BTLs 210 are selected to ensure specific micro cavity design for each of the red, green, and blue subpixels. In the hybrid pixel assembly, the BTLs 210 have two roles—one is to further adjust the cavity strength as well as to ensure that the layer next to the emissive layer has a band gap higher than that of the emissive species itself. In the case of the red and green phosphorescent organic emission layers 200-R, 200-G, the BTL 210 should have a triplet energy that is higher than the triplet energy of the emitter material. Furthermore, the BTL 210 energy levels (HOMO, LUMO) may be selected to facilitate hole or electron blocking functionality next to the emissive layer.

Figure 6:
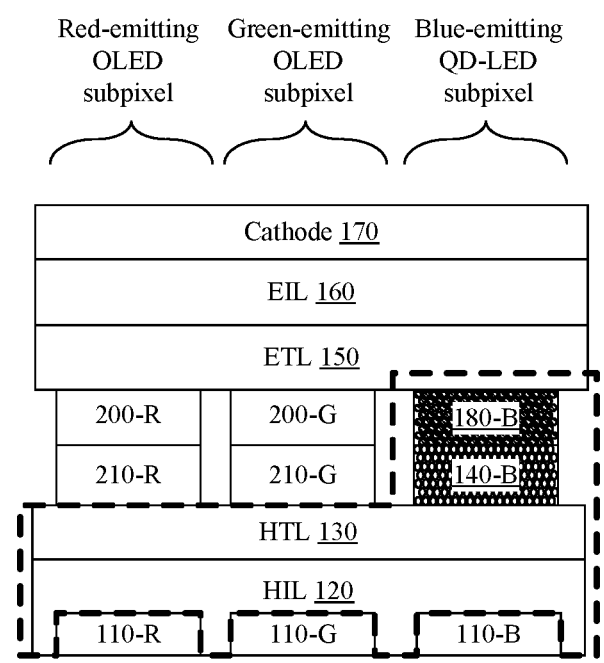
FIG. 6 is a schematic cross-sectional side view illustration of a hybrid pixel including a patterned quantum dot layer in accordance with an embodiment.

FIG. 6 is a schematic cross-sectional side view illustration of a hybrid pixel including a patterned QD layer 140 in accordance with an embodiment. In the embodiment illustrated, separate anodes 110-R, 110-G, 110-B are provided for each separate subpixel (e.g. RBG). A common HIL 120 and common HTL 130 are formed over the separate anodes 110-R, 110-G, 110-B.

In the particular embodiment illustrated in FIG. 6, the blue-emitting QD-LED subpixel includes a QD layer 140 formed on the common HTL 130, and a nanoparticle ETL 180 (e.g. ZnO nanoparticles) formed on the QD layer 140. In one embodiment, the QD layer 140 and nanoparticle ETL 180 are formed using any of the previously described solution-based techniques. In another embodiment, the QD layer 140 and nanoparticle ETL 180 are transfer printed either separately, or together as a layer stack. Following the formation of the QD layer 140 and nanoparticle ETL 180, the remainder of the layers may be fabricated, for example, by thermal evaporation.

Still referring to FIG. 6, buffer transport layers 210-R, 210-G are formed on the common HTL 130, followed by the formation of red and green emitting organic emission layers 200-R, 200-G on the BTLs 210-R, 210-G. In the arrangement illustrated in FIG. 6, 210-R, 210-G are BTLs in the red and green OLED subpixels, and are both serving as electron blocking layers. Exemplary materials may include carbazole and triphenylene based organic compounds, which may be formed by thermal evaporation. A common ETL 150 may then be formed on the organic emission layers 200-R, 200-G, and the nanoparticle ETL 180. A common EIL 160 may then be formed over the common ETL 150, followed by the formation of a common cathode 170 layer.

As shown in FIG. 6, the hybrid pixel arrangement includes a QD-LED stack structure similar to that illustrated in FIG. 2 or FIG. 4. In other embodiments, the hybrid pixel arrangement may optionally include an insulating layer 185, and/or HTL 190 as previously described with regard to FIGS. 3 and 5. Additionally, the nanoparticle ETL 180 may optionally be removed.

Referring now to FIGS. 7-9 additional hybrid pixel arrangements are illustrated including a common QD layer 140 in accordance with embodiments. In such arrangements, additional processing operations associated with patterning the QD layer 140 may be removed, which may reduce time of production. This may additionally eliminate resolution (e.g. pixels per inch) constraints related to patterning or printing.

FIG. 7 is a schematic cross-sectional side view illustration of a hybrid pixel similar to FIG. 6, with common QD layer 140, and no nanoparticle ETL 180. Additionally, the optional BTLs 210-R, 210-G are removed. In the embodiment illustrated, the common ETL 150 is formed on organic emission layers 200-R, 200-G in the OLED subpixels, and on the common QD layer 140 in the QD-LED subpixel.

FIG. 8 is a schematic cross-sectional side view illustration of a hybrid pixel similar to FIG. 6, with common QD layer 140, and common nanoparticle ETL 180 formed on the common QD layer 140. In the embodiment illustrated, the common ETL 150 is formed on organic emission layers 200-R, 200-G in the OLED subpixels, and on the common nanoparticle ETL 180 in the QD-LED subpixel.

FIG. 9 is a schematic cross-sectional side view illustration of a hybrid pixel similar to FIG. 7, with BTLs 210-R, 210-G formed on the organic emission layers 200-R, 200-G, respectively. The BTLs 210-R, 210-G in FIG. 9 are distinguishable from the BTLs illustrated in FIGS. 6 and 8, in that the BTLs 210-R, 210-G in FIG. 9 serve as hole blocking layers as opposed to electron blocking layers. Exemplary materials for BTLs serving as hole blocking layers may include organometallic wide band gap compounds (hole blocking) and other organic compounds (e.g. substituted benzimidazoles), which may be formed by thermal evaporation.

FIG. 10 is a schematic cross-sectional side view illustration of a hybrid pixel similar to FIG. 9, with a common BTL 210 being formed on the organic emission layers 200-R, 200-G and common QD layer 140, as opposed to separate BTLs being formed in each OLED subpixel In other embodiments, the hybrid pixel arrangements illustrated in FIGS. 7-9 may optionally include a common insulating layer 185, and/or common HTL 190 as previously described with regard to FIGS. 3 and 5.

Figure 11:
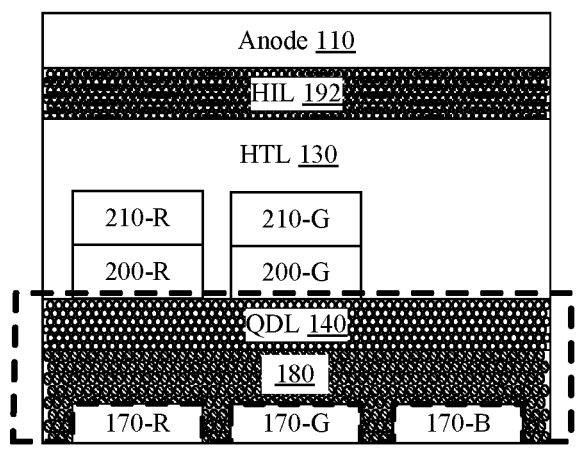
FIG. 11 is a schematic cross-sectional side view illustration of an inverted hybrid pixel including a common quantum dot layer in accordance with an embodiment.

FIG. 11 is a schematic cross-sectional side view illustration of an inverted hybrid pixel including a common QD layer 140 in accordance with an embodiment. In the embodiment illustrated, separate cathodes 170-R, 170-G, 170-B are provided for each separate subpixel (e.g. RBG). In an embodiment, the cathodes 170-R, 170-G, 170-B are formed of ITO. A common nanoparticle ETL 180 is formed over the separate cathodes 170-R, 170-G, 170-B, followed by the formation of a common QD layer 140 over the common nanoparticle ETL 180. Similar to the arrangements illustrated in FIGS. 7-10, the arrangement in FIG. 11 may eliminate the resolution constraints associated with patterning or printing. Still referring to FIG. 11, organic emission layers 200-R, 200-G are formed on the QD layer 140, followed by the formation of BTLs 210-R, 210-G on the organic emission layers 200-R, 200-G, respectively, for example using thermal evaporation. A common HTL 130 is then formed on the BTLs 210-R, 210-G in the OLED subpixels, and the common QD layer 140 in the QD-LED subpixel. A common HIL 192 may then be formed over the common HTL 130, for example, using thermal evaporation. Exemplary materials of HIL 192 include hexaazatriphenylene-hexacarbonitrile (HAT-CN) or molybdenum oxide (MoOx). A common anode 110 layer is then formed over the common HIL 192. In an embodiment, the common anode 110 layer is formed of aluminum.

Figure 12:
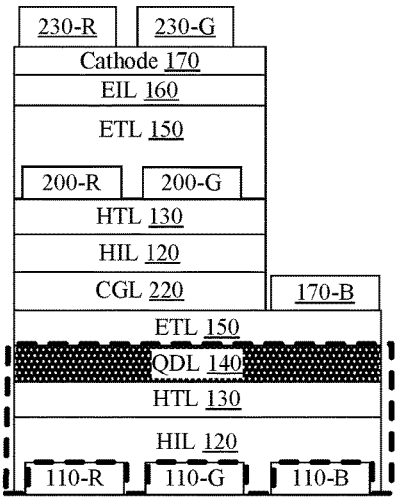
FIGS. 12-18 are schematic cross-sectional side view illustrations of hybrid pixels including tandem structure stacks in accordance with embodiments.

Referring now to FIGS. 12-18 various configurations of hybrid pixels including tandem structure stacks are provided in accordance with embodiments, in which multiple emitting units are stacked vertically. Referring to FIG. 12, a QD layer 140, HTL 130, HIL 120 may be formed over separate anodes 110-R, 110-G, 110-B similarly as previously described with regard to FIG. 7, followed by the formation of a common ETL 150 over the common QD layer 140 in the OLED subpixels and the QD-LED subpixel. A separate cathode 170-B may then be formed on the common ETL 150 in the QD-LED subpixel, while a semi-common charge generation layer (CGL) 220 is formed on the common ETL 150 in the OLED subpixels. As illustrated, the semi-common CBL 220 is common to the OLED subpixels only.

In accordance with embodiments, the CGL 220 is used to connect an assembly of two emissive layers in tandem with each other. It provides positive (hole) current to the upper (with reference to the figures) emissive layers (e.g. 200-R, 200-G) and negative (electron) current to the lower emissive layer (e.g. QD layer 140). Typically a CGL 220 is comprised of two distinct layers. For example, the electron current can be provided by a layer comprised of alkali metal salts such as LiF, low work function metals such as Ca, Ba, and n-doped material (e.g. combination of electron transport material and electron donating material). The hole current can be provided by a layer comprised of combination of arylamine based hole transport host and electron accepting dopant (e.g. charge transfer salts), strongly electron accepting small organic molecules, metal oxides. In accordance with embodiments, CGL 220 is formed by thermal evaporation.

A semi-common HIL 120 may then be formed on the semi-common CGL 220, followed by the formation of a semi-common HTL 130 on the semi-common HIL 120. Organic emission layers 200-R, 200-G may then be formed on the semi-common HTL 130 in separated OLED subpixels. A semi-common ETL 150 may then be formed over both organic emission layers 200-R, 200-G, followed by the formation of a semi-common EIL 160, and a semi-common cathode 170 in both OLED subpixels. A red color filter 230-R may optionally be formed over the semi-common cathode 170 in the red emitting OLED subpixel, and a green color filter 230-G may optionally be formed over the semi-common cathode 170 in the green emitting OLED subpixel.

Figure 13:
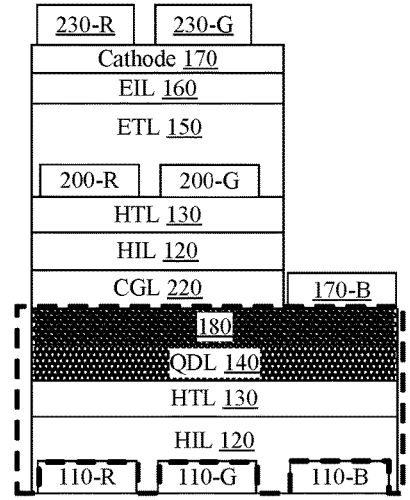

FIG. 13 is a schematic cross-sectional side view illustration of a hybrid pixel including a tandem structure stack similar to that provided in FIG. 12 with one difference being the substitution of nanoparticle ETL 180 in place of ETL 150. Additionally, nanoparticle ETL 180 may be fabricated using a solution-based technique.

Figure 14:
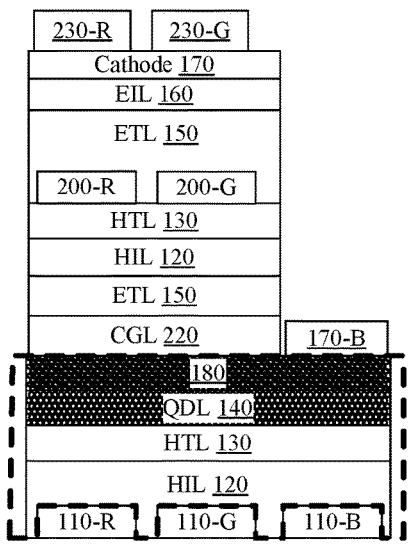

FIG. 14 is a schematic cross-sectional side view illustration of a hybrid pixel including a tandem structure stack similar to that provided in FIG. 13 with one difference being the addition of semi-common ETL 150 between the semi-common CGL 220 and the semi-common HIL 120.

Figure 15:
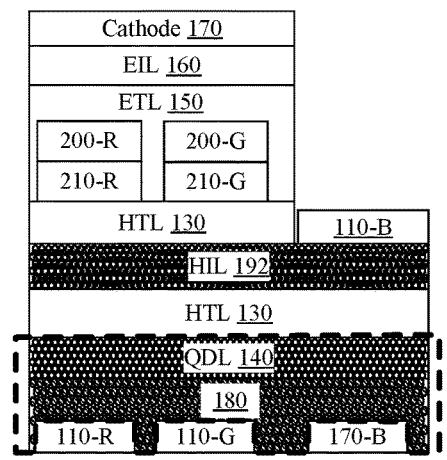

Referring now to FIG. 15 a schematic cross-sectional side view illustration of a hybrid pixel including a tandem structure stack is provided in accordance with an embodiment in which the QD-LED subpixel is inverted. As shown, a common nanoparticle ETL 180 may be formed over separate anodes 110-R, 110-G, and cathode 170-B. In an embodiment, anodes 110-R, 110G, and cathode 170-B are formed of the same material, such as ITO. A common QD layer 140 may then be formed over the common nanoparticle ETL 180. The common nanoparticle ETL 180 and common QD layer 140 may be formed using solution-based techniques. A common HTL 130 may then be formed over the common QD layer 140, followed by the formation of a common HIL 192 over the common HTL 130, for example by thermal evaporation. An anode 110-B may then be formed on the common HIL 192 in the QD-LED subpixel, while a semi-common HTL 130 is formed on the common HIL 192 in the OLED subpixels.

BTLs 210-R, 210-G are then formed on the semi-common HTL 130 in the red-emitting and green-emitting OLED subpixels, followed by the formation of organic emission layers 200-R, 200-G on the BTLs 210-R, 210-G. In the arrangement illustrated in FIG. 15, 210-R, 210-G are BTLs in the red and green OLED subpixels, and are both serving as electron blocking layers. Exemplary materials may include carbazole and triphenylene based organic compounds. A semi-common ETL 150 is then formed over the organic emission layers 200-R, 200-G, followed by the formation of a semi-common EIL 160 on the semi-common ETL 150, and a semi-common cathode 170 on the semi-common EIL 160.

Figure 16:
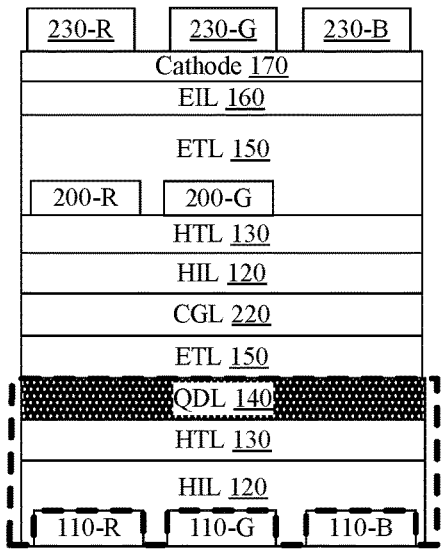
Figure 17:
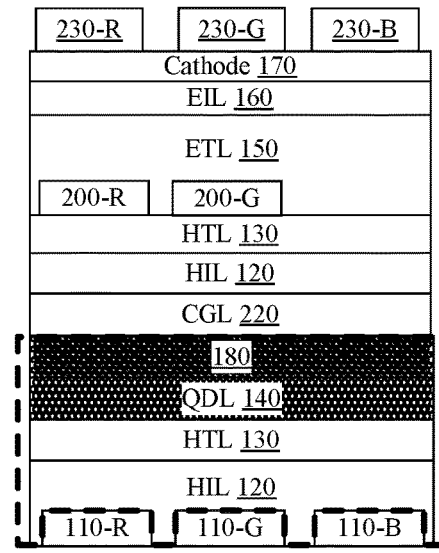
Figure 18:
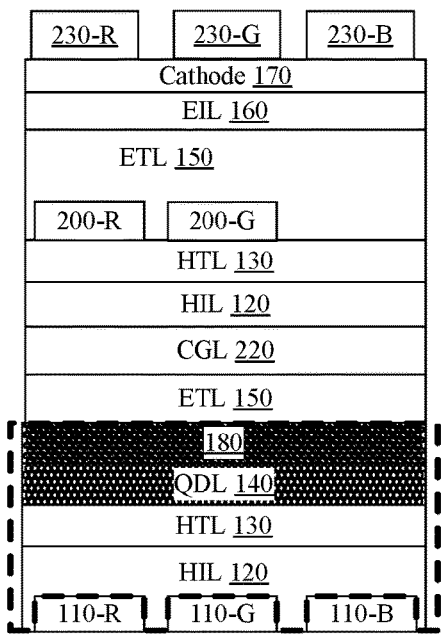

Referring now to FIGS. 16-18, schematic cross-sectional side view illustrations of hybrid pixels including tandem structure stacks are provided similar to those in FIGS. 12-14 with one difference being that a separate cathode 170 is not provided for the QD-LED subpixel, and the previously described and illustrated semi-common layers are now common layers across both the OLED subpixels and the QD-LED subpixel. Additionally, a blue color filter 230-B may be formed over the common cathode 170 layer in the QD-LED subpixel.

Figure 19:
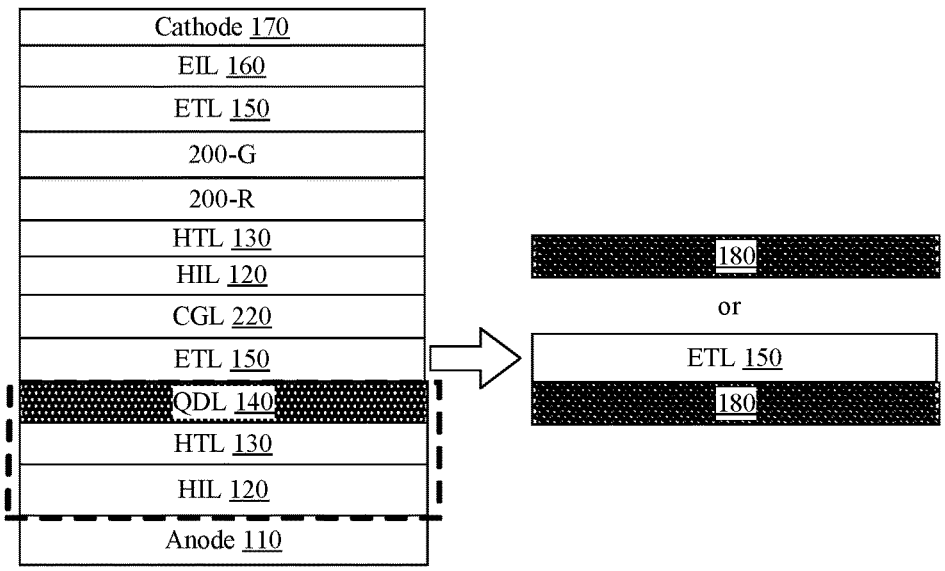
FIGS. 19-20 are schematic cross-sectional side view illustrations blended emission tandem structure stacks in accordance with embodiments.
Figure 20:
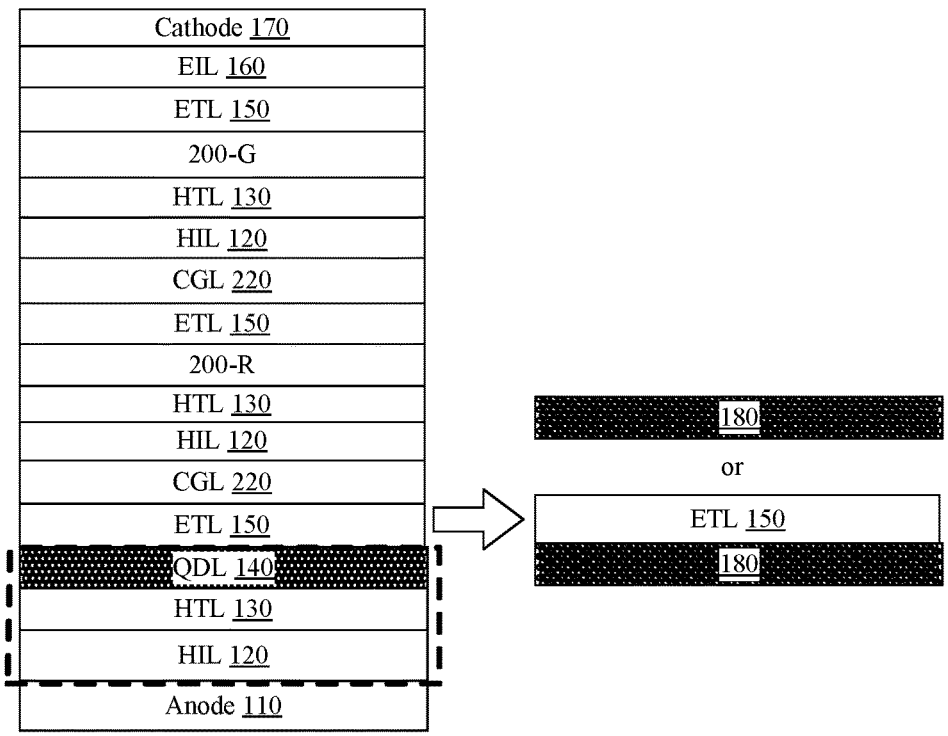

FIGS. 19-20 are schematic cross-sectional side view illustrations blended emission tandem structure stacks in accordance with embodiments. As such, the structures illustrated in FIGS. 19-20 may be utilized to emit a blended spectrum, such as white light. As illustrated in FIGS. 19-20, each layer may be a common layer formed on top of another common layer. In both embodiments illustrated in FIGS. 19-20, the ETL 150 formed above the solution-based layers may be substituted with a solution-based nanoparticle ETL 180, or ETL 150 may be formed on top of a solution-based nanoparticle ETL 180.

In utilizing the various aspects of the embodiments, it would become apparent to one skilled in the art that combinations or variations of the above embodiments are possible for forming hybrid OLED/QD-LED pixels. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A display comprising:
 a hybrid pixel including an organic light emitting diode (OLED) subpixel and a quantum dot light emitting diode (QD-LED) subpixel;
 a common hole transport layer in the OLED subpixel and the QD-LED subpixel;
 a common quantum dot layer over the common hole transport layer in the QD-LED subpixel and the QD-LED subpixel;
 an organic emission layer over the common hole transport layer in the OLED subpixel and over the common quantum dot layer in the OLED subpixel, wherein the organic emission layer comprises a phosphorescent material;
 a common electron transport layer over the common quantum dot layer in the QD-LED subpixel, and over the organic emission layer in the OLED subpixel;
 a common top electrode layer over the common electron transport layer in the OLED subpixel and the QD-LED subpixel.

2. The display of claim 1, further comprising:
 a common hole injection layer in the OLED subpixel and the QD-LED subpixel;
 wherein the common hole transport layer is over the common hole injection layer in the OLED subpixel and the QD-LED subpixel.

3. The display of claim 1, further comprising:
 a common electron injection layer over the common electron transport layer in the OLED subpixel and the QD-LED subpixel;
 wherein the common top electrode layer is over the common electron injection layer in the OLED subpixel and the QD-LED subpixel.

4. The display of claim 1, further comprising:
 a common nanoparticle electron transport layer comprising metal-oxide nanoparticles over the common quantum dot layer in the OLED subpixel and the QD-LED subpixel.

5. The display of claim 4, further comprising a common insulating layer between the common quantum dot layer and the common nanoparticle electron transport layer comprising metal-oxide nanoparticles in the OLED subpixel and the QD-LED subpixel.

6. The display of claim 1, further comprising:
 a buffer transport layer over the common quantum dot layer in the OLED subpixel;
 wherein the organic emission layer is over the buffer transport layer.

7. The display of claim 1, further comprising:
 a buffer transport layer over the organic emission layer in the OLED subpixel.

8. The display of claim 1, further comprising a common buffer transport layer over the organic emission layer in the OLED subpixel, and over the common quantum dot layer in the QD-LED subpixel.

9. The display of claim 1, further comprising:
 a common metal oxide nanoparticle hole transport layer comprising metal-oxide nanoparticles over the hole transport layer the OLED subpixel and the QD-LED subpixel;
 wherein the common quantum dot layer is over the common metal oxide nanoparticle hole transport layer in the OLED subpixel and the QD-LED subpixel.

10. A method of forming a display comprising:
 forming a common hole transport layer over a display backplane in using a first solution technique, wherein the common hole transport layer is formed over the display backplane in a hybrid pixel including an OLED subpixel and a QD-LED subpixel;
 forming a common quantum dot layer over the common hole transport layer in the QD-LED subpixel and the OLED subpixel;
 evaporating an organic emission layer over the common hole transport layer in the OLED subpixel and over the common quantum dot layer in the OLED subpixel, wherein the organic emission layer comprises a phosphorescent material;
 evaporating a common electron transport layer over the common quantum dot layer in the QD-LED subpixel, and over the organic emission layer in the OLED subpixel; and
 forming a common top electrode layer over the common electron transport layer in the OLED subpixel and the QD-LED subpixel.

11. The method of claim 10, wherein forming the common quantum dot layer comprises using a second solution-based technique.

12. The method of claim 11, wherein evaporating the common electron transport layer comprises evaporating the common electron transport layer over the common quantum dot layer in the OLED subpixel and the QD-LED subpixel.

13. The method of claim 11, further comprising forming a common nanoparticle electron transport layer comprising metal-oxide nanoparticles over the common quantum dot layer in the OLED subpixel and the QD-LED subpixel using a third solution-based technique.

* * * * *